United States Patent [19]

Ferralli

[11] Patent Number: 4,844,198

[45] Date of Patent: Jul. 4, 1989

[54] PLANE WAVE FOCUSING LENS

[76] Inventor: Michael W. Ferralli, 7275 Springside Dr., Fairview, Pa. 16415

[21] Appl. No.: 178,906

[22] Filed: Apr. 7, 1988

[51] Int. Cl.⁴ .................................... H05K 5/00

[52] U.S. Cl. .................................... 181/155; 181/175; 181/176; 181/199; 381/155; 381/160

[58] Field of Search ............... 181/155, 175, 176, 199; 387/155, 160

[56] References Cited

U.S. PATENT DOCUMENTS

| | | | |
|---|---|---|---|
| 711,974 | 10/1902 | Hyde | 181/176 X |
| 1,716,199 | 6/1929 | Hofe et al. | 181/175 |
| 2,087,052 | 7/1937 | Steuart | 181/175 |
| 4,550,609 | 11/1985 | Johnson | 181/176 X |
| 4,629,030 | 12/1986 | Ferralli | 181/155 |

OTHER PUBLICATIONS

C. A. Balanis, Antenna Theory–Analysis and Design, Harper & Row, Publishers, Inc., New York, NY, 1982, pp. 604–642.

*Primary Examiner*—B. R. Fuller

[57] ABSTRACT

A lens incorporates two reflective shells. One shell's surface is generated when a parabola is rotated around a line which lies in the parabolic plane perpendicular to its axis of symmetry. The other shell's surface is generated when an ellipse is rotated about a line lying in the elliptic plane and passing through one focal point at a finite angle to its major axis. The parabolically-generated shell has a characteristic focal curve while the elliptically-generated shell has both a characteristic focal curve and a focal point. The lens incorporates these shells which are aligned so that they have coincident focal curves and axes of rotation. Plane wave radiation travelling parallel to the axis of rotation of the lens will be focused at the focal point of the elliptically-generated shell. Conversely, a transducer placed about this common focal point and can produce radiation which will be converted into a plane wave radiation. Additional transducers can be placed at the lens' focal curve to process the radiation for signal tracking and self-alignment. The lens operates as a transmitter or receiver of acoustic or electromagnetic radiation.

16 Claims, 4 Drawing Sheets

PLANE WAVE FOCUSING LENS

FIELD OF THE INVENTION

This invention relates to acoustic and electromagnetic transducers and specifically to an improved plane wave focusing acoustic and electromagnetic reflective lens system.

DISCUSSION OF PRIOR ART

Heretofore a significant limitation of the current state of the art acoustic and electromagnetic lens has been their frequency dependent focal point, inability to efficiently focus acoustic or electromagnetic energy from continuous or shock waves to a precise point, and their lack of a provision for alignment to or tracking of radiation to be received.

Recently, a transducer system appeared in the state of the art which focuses acoustic or electromagnetic energy by use of an enclosure which is shaped as the envelope of ellipsoids having radially oriented distinct focal points as well as a common focal point. Transducers placed at the distinct focal points will have their acoustic or electromagnetic radiation focused at the common focal point and, provided that the ellipsoids have essentially identical pathlengths from distinct focal point to ellipsoid to common focal point, their acoustic or electromagnetic energy will be coupled in phase. In order for this lens to focus most of the energy from transducers located at the distinct focal point, each elliptical section must be large enough to enclose each transducer. Since each transducer must be radially oriented from one another, each section must occupy an area which decreases in proportion to the number of transducers used. Thus, for a modest number of incorporated transducers, a high probability exists that energy radiated from a transducer will strike a lens section associated with a neighboring transducer and not be effectively focused. Thus, this system will function effectively only when relatively few transducer are incorporated. Additionally, since each radial section of the lens has a shape conforming to an ellipse of revolution, each transducer must be shaped so as to produce radiation which appears to emanate from the distinct focal point associated with each section. Manufacture of such transducers is difficult and expensive, and coupling of each transducer so that they produce identical, phase-matched acoustic or electromagnetic radiation is a complex procedure. Another transducer system which has appeared in the state of the art overcomes this radial interference problem by use of an acoustic or electromagnetic reflective lens whose shape is produced when a section of an ellipse is revolved about a line which passes through one of the focal points of the ellipse at some finite angle with respect to the ellipse major axis. This lens incorporates a focal circle and a focal point. One focal point, common to all the ellipses, is positioned directly above the center of the reflective lens while the other focal points of the ellipses describe a circle within an area partially enveloped by the lens A ring or torus shaped transducer placed at this focal circle, will have its radiation reflected from the lens surface and, owing to the elliptical shape of the sides of the lens, focused coherently onto the common focal point referred to above. Manufacture of such a ring or torus shaped transducer is difficult and the procedure necessary in order to cause the transducer to produce a phase-matched acoustic or electromagnetic radiation pattern is complex. Other, more common acoustic lenses consist of a series of wave guides which are shaped and aligned so as to caused the radiation traveling through each to be focused at a common point. These conventional acoustic lenses are deficient in that they tend to reflect energy from their surface due to the difference in impedance represented by the acoustic lens and the characteristic impedance of the medium in which the acoustic wave is traveling. Also the conventional lenses tend to have frequency dependent focal lengths in a manner similar to optical lenses. Additionally, other focusing devices such as spherical and parabolic reflectors are utilized to collect and focus electromagnetic or acoustic radiation These devices function solely to collect radiation and without the use of sophisticated electronic processing of the radiation received, these devices cannot effectively by used to track or align with the radiation to be received.

OBJECTS

Accordingly, an object of this invention is to provide a geometrically shaped reflective lens for a transducing element such that all pathlengths from the transducing element surface to the lens focal element are substantially identical. Another object of this invention is to provide a geometrically shaped reflective lens which will focus acoustic or electromagnetic waves produced by the plane transducing element or plane wave acoustic or electromagnetic radiation to a focal point which is characteristic of the lens. Another object of the invention provide for the relative consistency of the focal length as a function of acoustic wave frequency.

It is another object of the invention to provide a single transducing element or a planar array of transducers which will appear to act as a single source whose position does not change as a function of the frequency of the radiation of the transducer or transducer array. It is another object of the invention to create a field of focused acoustic or electromagnetic radiation whose beam shape is controlled by a geometrically shaped lens.

It is another object of this invention to transduce essentially plane wave type electromagnetic energy into electrical energy.

It is another object of this invention to create an essentially plane wave of acoustical or electromagnetic energy from radiation emanating from an appropriate transducing element.

It is another object of this invention to provide for a means whereby the lens system can be made to align with and/or track received acoustic or electromagnetic radiation.

DRAWINGS

FIG. 1 is a full section as viewed from the side of one embodiment of the invention utilizing a shell whose shape is comprised of both a solid section generated when a portion of the exterior area bounded by a parabola is rotated around a line which lies in the plane of the parabola, is oriented parallel to the major axis of said parabola, and contains a transducing element which is oriented perpendicularly to the aforesaid line such that radiation emitted therefrom is concentrated upon the focal circle of said shape, and a solid section generated when a portion of the exterior area bounded by an ellipse is rotated around a line which lies in the plane of the ellipse and passes through one focal point of said ellipse at a finite angle with respect to the ellipse major axis, such that the elliptical solid section has a characteristic focal circle and focal point, and such that both solid sections are oriented with respect to one another so that the characteristic focal circles of each coincide. In this particular embodiment, the section of the parabola-generated shell utilized passes through the interior to the area bounded by the focal circle while the section of the ellipse-generated shell utilized lies exterior to the focal circle.

DESCRIPTION

Figure 1:
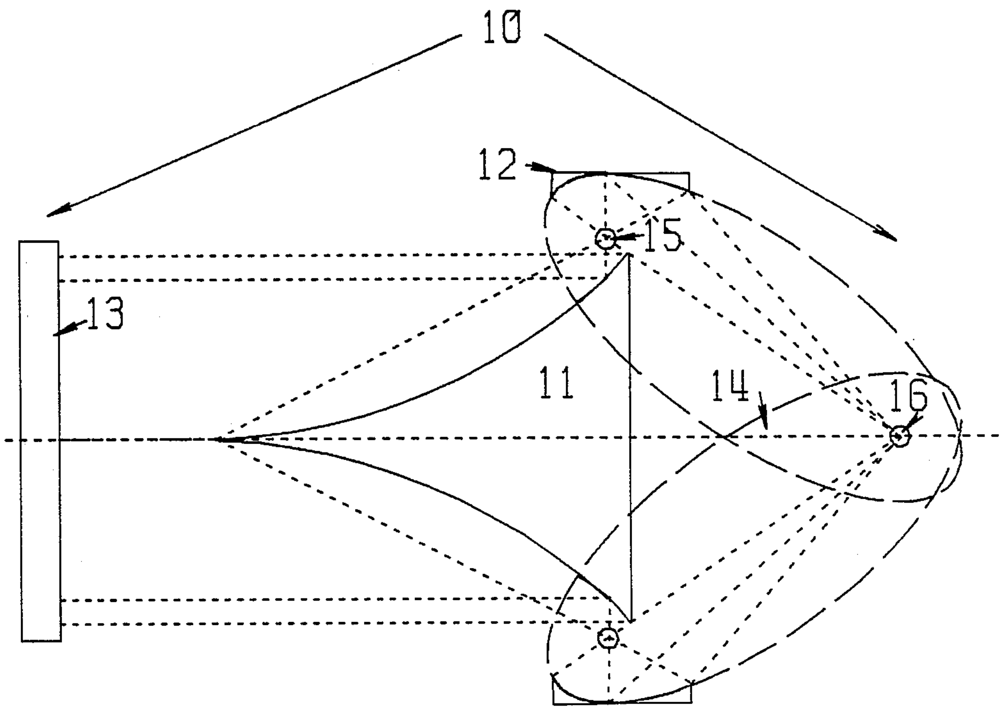
Figure 2:
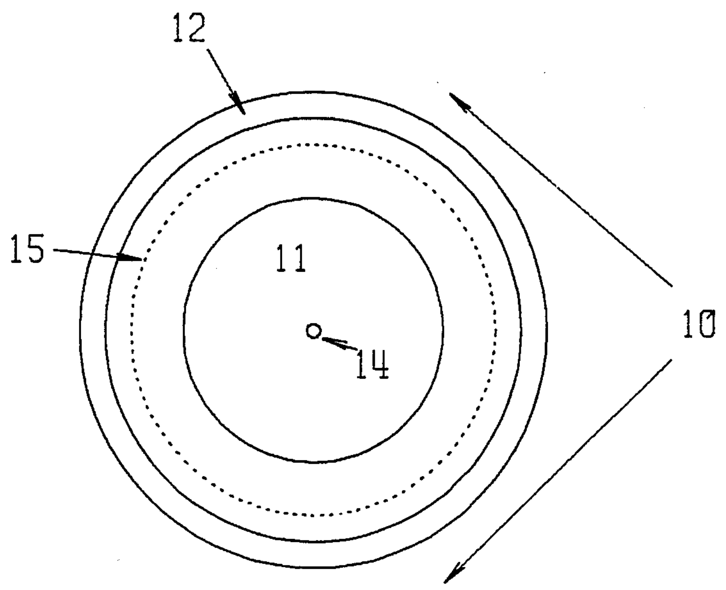
FIG. 2 is a front view thereof (with transducing element omitted).

FIGS. 1 and 2 of the drawings illustrate the side and front views of a transducer designed to focus acoustic or electromagnetic energy from either a transducing element placed therein or from received plane wave electromagnetic or acoustic energy . The transducer 10 incorporates two geometrically shaped shells, which consists of sections 11 and 12, and a transducing element 13, which is shaped so as to produce at least an approximation to a section of a plane wave, and which is located so a to be perpendicular and centered about the line 14, the axis of rotation of the shell sections 11 and 12. The shape of shell section 11 is generated when a parabola is rotated about line 14 which lies in the plane of the parabola and is parallel to the parabola's major axis. The focal point of said parabola, when rotated about line 14, generates a focal circle 15. The shape of shell section 12 is generated when an ellipse is rotated about line 14 which lies in the plane of the ellipse and passes through one focal point of the ellipse at a finite angle $\theta$. Such a rotation of the ellipse will produce a solid figure which contains both a focal point 16, and a focal circle 15. As is illustrated in FIG. 1, shell sections 11 and 12 are oriented so that they share the same axis of rotation, line 14, and have the same focal circle 15. Additionally, shell section 12 lies exterior to the area bounded by the focal circle 15 while shell section 11 passes through this bounded area. The transducing element 13 is oriented perpendicular to the line 14 so that a plane wave generated by the element 13 will, upon striking and being reflected by shell section 11 be focused and concentrated upon focal circle 15. The wave will be reradiated from focal circle 15 and upon striking and being reflected by shell section 12, be focused and concentrated upon focal point 16. Suitable materials for the shell sections 11 and 15 include wood, metal, reinforced resin, or other structural, acoustically or electromagnetically reflective, material. The transducing element 13 may be made of plastic, metal, resin impregnated cloth, or other suitable material. Additionally the transducing element 13 may be omitted if the transducer is utilized as a receiver of plane wave acoustic or electromagnetic energy. The dimensions of the device may vary in order to suit the desired end use, but it is to be understood in all cases that for most efficient operation the dimensions of the transducer should be larger than the longest wavelength of acoustic or electromagnetic radiation to be processed by the transducer.

Figure 3:
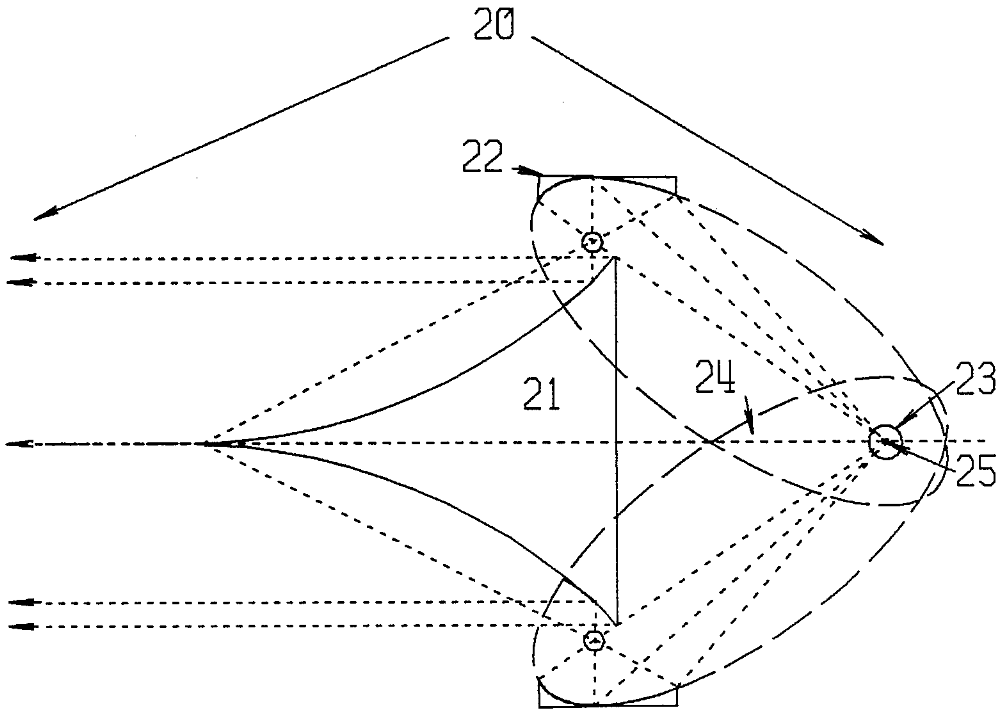
FIG. 3 is a full section as viewed from the side of an embodiment of the invention wherein the transducing element is placed at the focal point of a shell whose shape is that generated when a parabola and ellipse are rotated as above described.

FIG. 3 of the drawings illustrate a view of another transducer designed to radiate acoustic or electromagnetic energy from a transducing element placed therein. The transducer 20 incorporates two geometrically shaped shells, shell sections 21 and 22 and incorporates a transducing element 23 centered about the focal point 25 of the shell section 22. The shell sections 21 and 22 are shaped substantially in the same manner as shell sections 11 and 12 respectively and contain a similar axis of rotation, line 24. Suitable material for the shell sections 21 and 22 include wood, metal, reinforced resin, or other structural material with reasonable acoustic reflection characteristics. The transducing element 23 may be made of plastic, metal, resin impregnated cloth, or other suitable material or may be a piezoelectric material, or may be a suitable electromagnetic transducer.

Figure 4:
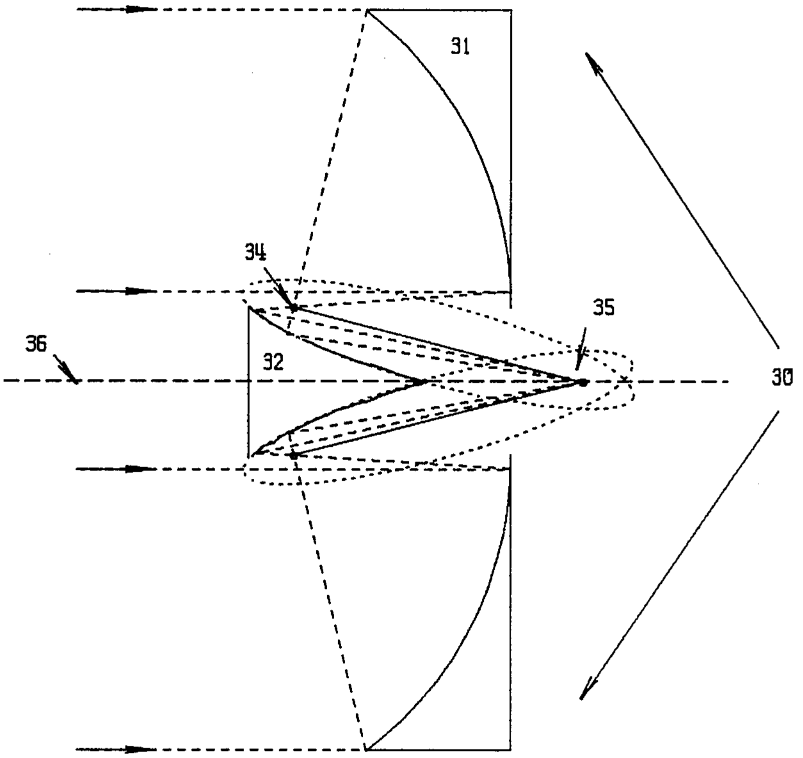
FIG. 4 is a full section as viewed from the side of an embodiment of the invention wherein alternate sections of the parabola-generated and ellipse-generated shells as described above are used. In this embodiment, the parabola-generated shell lies exterior to the area bounded by the focal circle while the ellipse-generated shell passes through the interior of the focal circle.

FIG. 4 of the drawings shows another embodiment of the invention. The transducer 30 incorporates shell sections 31 and 32, which are produced in the substantially same manner as sections 11 and 12 of FIG. 1. The sections 31 and 32 will each have a focal circle 34, which is made common to both. However the embodiment illustrated in FIG. 4 differs in that the shell section 31 is comprised of that section of a parabola-generated shell which lies exterior to the focal circle 34 and the shell section 32 is comprised of that section of a elliptically-generated shell which passes through the interior of focal circle 34. Transducing elements, although not illustrated, may be placed at the focal point 35 of the transducer if plane wave production or reception is desired or in a position similar to the position of the transducing element in FIG. 1 if concentration and focusing of a plane wave at focal point 35 is desired, or may be omitted if the device is to function as a receiver of plane wave radiation. Materials suitable for the shell sections and transducing elements are similar to those described for the previous embodiments.

OPERATION

In the operation of the transducer 10, acoustic or electromagnetic radiation from the transducing element 13 or, if transducing element 13 is omitted, any plane wave radiation is directed substantially toward shell sections 11 and 12. The transducing element 13 converts an electrical signal to an acoustical signal or electromagnetic signal by any methods known in the state of the art such as by a transmitting antenna or piezoelectric means. The transducing element 13 is at least approximately centered about the line 14, and the acoustic or electromagnetic signal produced by it appears to at least approximate a section of a plane wave. The acoustic or electromagnetic signal produced by the transducing element 13 will be reflected from shell section 11 and concentrated and focused in the region of the focal circle 15. Since all radiation produced from any point on transducing element 13 is of the same phase, and since all radiation from the transducing element 13 travels the same pathlength to the focal circle 15, all radiation arriving at the focal circle 15 will be in phase. The dotted lines in FIG. 1 indicate a number possible paths from the transducer element 13 to the focal circle 15. Acoustic or electromagnetic radiation emanating from the region of the focal circle 15 would strike shell section 12 and be emitted from the transducer 10 as a phase coherent wave focused upon focal point 16. The shell sections 11 and 12, being parabolically and elliptically generated as hereinbefore described will cause all acoustic or electromagnetic radiation from the transducing element 13 to travel the same distance in reaching the focal circle 15 and focal point 16 and thus all acoustic or electromagnetic radiation arriving at focal circle 15 and focal point 16 will arrive in phase so long as all points on the transducing element 13 produce phase matched acoustic radiation, or the plane wave striking the transducer is similarly spatially phase matched. The embodiment of the invention illustrated in FIGS. 1 and 2 will thus act to focus plane wave acoustic or electromagnetic radiation onto a focal circle and a focal point. Optionally and additionally, transducing elements, not shown in the figure, could be placed upon the focal circle 15 and the signal received therefrom may be electronically processed by methods known in the state of the art to allow the transducer to align and/or track the radiation to be received. Such a signal could also be processed to establish a characteristic of the object transmitting the received signal and thus the transducer could operate to track an identified object.

The embodiment of the invention illustrated in FIG. 3 illustrates a transducer 20, which contains shell sections 21 and 22, and transducing element 23, operates in a manner similar to that illustrated in FIGS. 1 and 2 except that the transducing element 23 is placed at the location of the focal point 25 and is shaped so as to produce radiation which will strike the elliptically shaped portion of shell section 22. Alternatively, transducing element 23 may be constrained to produce the aforesaid radiation pattern by means of an appropriately shaped exit (not shown in the figure). Acoustic radiation produced by a thusly shaped transducing element 23 will, upon reflection from the shell sections 21 and 22, be emitted from the transducer as a plane wave. A conventional parabolic reflector utilizes a transducing element which, being on the reflective side of the parabolic shape, acts to block some of the radiated energy. Thus this embodiment of the invention can produce a more uniform plane wave than a conventional parabolic reflector. Conversely, this embodiment of the invention can allows a transducing element receiver to collect more energy from a plane wave. Additionally this embodiment of the invention, as well as the embodiment illustrated in FIGS. 1 and 2, contain a focal circle. All radiation which passes through these embodiments will be initially focused upon the focal circle such that a plane wave traveling in a direction parallel to the axis of rotation described in these embodiments will be simultaneously focused upon this focal circle such that radiation arriving at all points upon the focal circle will be in phase. Conversely, plane wave radiation which does not travel in the direction of the aforesaid axis of rotation will strike these embodiments of the invention such that the radiation focused upon the focal circle will not be in phase. Information gained by the electronic comparison of the phase and amplitude of the signal arriving at this focal circle can be easily used to align the transducer described in these embodiments so that the plane wave radiation travels in a direction parallel with the axis of rotation. As will be obvious to one skilled in the art, plane wave radiation traveling in a direction parallel to the axis of rotation will produce the strongest signal and thus these embodiments of the invention may be uniquely used as self-aligning and/or tacking antennas. The signal received by transducers placed on the focal circle can also be used to identify the transmitting object and thus the transducer can operate as a tracking device for an identified object.

The embodiment of the invention illustrated in FIG. 4 operates in a manner similar to that illustrated in FIGS. 1 and 2 except that the positions of the parabolically-generated and elliptically generated shells are reversed. Plane wave radiation traveling in a direction parallel to the axis of rotation illustrated in this figure will strike the parabolically-generated shell, be reflected and focused upon the focal circle, be re-emitted, strike and be reflected from the elliptically-generated shell and be focused upon the common focal point. As can be easily seen the embodiments can be incorporated with additional transducers locate at the focal circle. These transducers can sample the radiation which can be processed to instill self-aligning and/or tracking properties the this embodiment in a manner similar to that explained in the embodiments illustrated in FIGS. 1,2 and 3.

It is to be understood that, although the discussion of the operation of the above described embodiments of the invention has considered the transducing element to be a radiator of acoustic or electromagnetic energy, the invention would obviously operate equally well as a receiver of such energy. When operating as a receiving transducer, the invention would function as a self-aligning and or tracking directional microphone or antenna. It is also to be understood that precise location of each of the components of the invention is not necessary for its operation due to the relatively long wavelengths associated with radiation. Tolerances in construction of the invention including the location of all elements thereof should not, in general, exceed $\frac{1}{4}$ of the wavelength of the highest frequency of radiation for which the invention is to be used. It is also to be understood that the invention would operate equally well as a transducer of electromagnetic radiation so long as the electromagnetic radiation wavelength is not smaller that the tolerances to which the invention could be constructed.

While the above description contains many specificities, these should not be construed as limitations on the scope of the invention, but rather as an exemplification of a number of preferred embodiments thereof. Accordingly, the scope of this invention should be determined not by the embodiments illustrated, but by the appended claims and their legal equivalents.

What is claimed is:

1. A transducer which comprises, in combination, a transducing means for generating acoustic radiation and two acoustically reflective shells wherein one of said shells, defined as a parabolically-generated shell, comprises at least a section that forms a parabolic structure, having a vertex and focal point, that generates a continuum of parabolas when rotated about a straight line, defined as an axis of rotation, which is parallel to and distinct from a separate straight line which passes through both the focus and vertex of said parabolic structure, said separate straight line being defined as a axis of the parabolic structure, and such that a resultant surface is that of at least a section of a surface formed by the continuum of said parabolas radially distributed about said axis of rotation, and such that the focal points of the continuum of said parabolas, being distinct from one another, are exterior to said continuum of parabolas, and form a curve, said curve being referred to as a distinct focal curve, and wherein the other of said shells, defined as an elliptically-generated shell, comprises at least a section that forms an elliptical structure having two focal points, that generates a continuum of ellipses when rotated about a straight line, defined as an axis of rotation, which passes through one focal point of said elliptical structure at a finite angle with respect to a major axis of the elliptical structure, said major axis defined as a straight line which passes through the said focal points of the elliptical structure, and such that a resultant surface is that of at least a section of a surface formed by a continuum of said ellipses radially distributed about an axis which is placed at a finite angle with respect to the said major axis of the elliptical structure, and such that one of the focal points of the elliptical structure is common to the continuum of said ellipses while the other focal points of the continuum of ellipses, being distinct from one another, are interior to said continuum of ellipses and form a focal curve, and such that the focal curve of the said parabolically-generated shell is placed coincident with the focal curve of the said elliptically-generated shell and such that both the parabolically-generated shell and the elliptically-generated shell have identical axes of rotation, and such that the said transducing means is located about the common focal point of the elliptically-generated shell so that acoustic radiation travelling in a direction parallel to the said axis of rotation will strike and be reflected from the parabolically generated shell, be focused upon the focal curve common to both the parabolically-generated and elliptically-generated shell, be re-emanated, strike and be reflected from the elliptically-generated shell, and be focused upon the common focal point of the elliptically-generated shell.

2. A transducer according to claim 1 wherein the acoustic transducing means is a receiver of acoustic radiation.

3. A transducer according to claim 1 wherein the acoustic transducing means is a generator of acoustic radiation.

4. A transducer according to claim 1 wherein the acoustic transducing means is located at a position which is both perpendicular to the axis of rotation of the acoustically reflective shells and placed on a side of the acoustically reflective shell opposite the common focal point of the elliptically-generated shell.

5. A transducer according to claim 1 wherein the acoustically reflective shells are reflective of electromagnetic radiation and wherein the transducing means is an electromagnetic transducing means for generating electromagnetic radiation.

6. A transducer according to claim 1 wherein the acoustically reflective shells are reflective of electromagnetic radiation and wherein the transducing means is an electromagnetic transducing means, for generating electromagnetic radiation, and wherein the electromagnetic transducing means is located at a position which is both perpendicular to the axis of rotation of the electromagnetically reflective shells and placed on a side of the electromagnetically reflective shells opposite the common focal point of the elliptically-generated shell.

7. A transducer according to claim 1 where, in addition to the acoustic transducing means located at the common focal point of the elliptically-generated shell, an array of other acoustic transducing means are placed about the focal curve of the transducer.

8. A transducer according to claim 1 wherein the acoustically reflective shells are reflective of electromagnetic radiation and wherein the transducing means is an electromagnetic transducing means for generating electromagnetic radiation, and where, in addition to the electromagnetic transducing means, an array of other electromagnetic transducing means are placed about the focal curve of the transducer.

9. A transducer which comprises, in combination, a transducing means for generating acoustic radiation and two acoustically reflective shells wherein one of said shells, defined as a parabolically-generated shell, comprises at least a section that forms a parabolic structure, having a vertex and focal point, that generates a continuum of parabolas when rotated about a straight line, defined as an axis of rotation, which is parallel to and distinct from a separate straight line which passes through both the focus and vertex of said parabolic structure, said separate straight line being defined as a axis of the parabolic structure, and such that a resultant surface is that of at least a section of a surface formed by the continuum of said parabolas radially distributed about said axis of rotation, and such that the focal points of the continuum of said parabolas, being distinct from one another, are interior to said continuum of parabolas, and form a curve, said curve being referred to as a distinct focal curve, and wherein the other of said shells, defined as an elliptically-generated shell, comprises at least a section that forms a elliptical structure having two focal points, that generates a continuum of ellipses when rotated about a straight line, defined as an axis of rotation, which passes through one focal point of said elliptical structure at a finite angle with respect to a major axis of the elliptical structure, said major axis defined as a straight line which passes through the said focal points of the elliptical structure, and such that a resultant surface is that of at least a section of a surface formed by a continuum of said ellipses radially distributed about an axis which is placed at a finite angle with respect to the said major axis of the elliptical structure, and such that one of the focal points of the elliptical structure is common to the continuum of said ellipses while the other focal points of the continuum of said ellipses, being distinct from one another, are exterior to said continuum of ellipses and form a focal curve, and such that the focal curve of the said parabolically-generated shell is placed coincident with the focal curve of the said elliptically-generated shell and such that both the parabolically-geneated shell and the elliptically-generated shell have identical axes of rotation, and such that the said transducing means is located about the common focal point of the elliptically-generated shell so that acoustic radiation travelling in a direction parallel to the axis of rotation will trike and be reflected from the parabolically generated shell, be focused upon the focal curve common to both the parabolically-generated and elliptically-generated shell, be re-emanated, strike and be reflected from the elliptically-generated shell, and be focused upon the common focal point of the elliptically-generated shell.

10. A transducer according to claim 9 wherein the acoustic transducing means is a receiver of acoustic radiation.

11. A transducer according to claim 9 wherein the acoustic transducing means is a generator of acoustic radiation.

12. A transducer according to claim 9 wherein the acoustic transducing means is located at a position which is both perpendicular to the axis of rotation of the acoustically reflective shells and placed on a side of the acoustically reflective shell opposite the common focal point of the elliptically-generated shell.

13. A transducer according to claim 9 wherein the acoustically reflective shells are reflective of electromagnetic radiation and wherein the transducing means is an electromagnetic transducing means for generating electromagnetic radiation.

14. A transducer according to claim 9 wherein the acoustically reflective shells are reflective of electromagnetic radiation and wherein the transducing means is an electromagnetic transducing means for generating electromagnetic radiation, and wherein the electromagnetic transducing means is located at a position which is both perpendicular to the axis of rotation of the electromagnetically reflective shells and placed on a side of the electromagnetically reflective shells opposite the common focal point of the elliptically-generated shell.

15. A transducer according to claim 9 where, in addition to the acoustic transducing means located at the common focal point of the elliptically-generated shell, an array of other acoustic transducing means are placed about the focal curve of the transducer.

16. A transducer according to claim 9 wherein the acoustically reflective shells are reflective of electromagnetic radiation and wherein the transducing means is an electromagnetic transducing means for generating electromagnetic radiation, and where, in addition to the electromagnetic transducing means, an array of other electromagnetic transducing means are placed about the focal curve of the transducer.

* * * * *